(12) United States Patent
Brunet et al.

(10) Patent No.: US 6,680,628 B2
(45) Date of Patent: Jan. 20, 2004

(54) METHOD AND DEVICE FOR FREQUENCY SYNTHESIS USING A PHASE LOCKED LOOP

(75) Inventors: Arnaud Brunet, Chambourcy (FR); Sébastien Rieubon, Echirolles (FR)

(73) Assignee: Alcatel, Paris (FR)

( * ) Notice: Subject to any disclaimer, the term of this patent is extended or adjusted under 35 U.S.C. 154(b) by 0 days.

(21) Appl. No.: 10/069,444

(22) PCT Filed: Jun. 28, 2001

(86) PCT No.: PCT/FR01/02064
§ 371 (c)(1), (2), (4) Date: May 22, 2002

(87) PCT Pub. No.: WO02/01721
PCT Pub. Date: Jan. 3, 2002

(65) Prior Publication Data
US 2002/0149430 A1 Oct. 17, 2002

(30) Foreign Application Priority Data
Jun. 30, 2000 (FR) .............................................. 00 08491

(51) Int. Cl.$^7$ .............................................. H03B 21/00
(52) U.S. Cl. ........................ 327/107; 327/156; 331/18
(58) Field of Search .................................. 327/105–107, 327/155–162; 331/1 A, 25, 17–18, DIG. 2; 375/376; 455/260, 550

(56) References Cited

U.S. PATENT DOCUMENTS

| | | | |
|---|---|---|---|
| 5,420,545 A | 5/1995 | Davis et al. ................. 331/17 |
| 5,847,611 A | * 12/1998 | Hirata ....................... 331/1 A |
| 6,236,278 B1 | * 5/2001 | Olgaard ....................... 331/25 |
| 6,249,685 B1 | * 6/2001 | Sharaf et al. ............... 455/550 |
| 6,414,555 B2 | * 7/2002 | Staszewski et al. .......... 331/18 |
| 6,556,086 B2 | * 4/2003 | Keaveney et al. .......... 331/1 A |

FOREIGN PATENT DOCUMENTS

| | | |
|---|---|---|
| EP | 0482823 A2 | 4/1992 |
| EP | 0641082 A2 | 3/1995 |
| EP | 0727877 A2 | 8/1996 |
| WO | WO 01/24374 A1 | 4/2001 |

* cited by examiner

*Primary Examiner*—Minh Nguyen
(74) *Attorney, Agent, or Firm*—Sughrue Mion, PLLC

(57) ABSTRACT

A frequency synthesis method using a phase locked loop including a phase comparator. The method includes switching from a fractional frequency division operating mode to an integer frequency division operating mode after a time or time-delay for stabilizing operation of the loop has elapsed. The method is characterized in that it consists of effecting the operating mode switching by masking or eliminating a portion of the pulses of a reference signal (Sref) and a comparison signal (Scomp) before they are applied to inputs of the phase comparator (3).

9 Claims, 2 Drawing Sheets

METHOD AND DEVICE FOR FREQUENCY SYNTHESIS USING A PHASE LOCKED LOOP

BACKGROUND OF THE INVENTION

The present invention relates to frequency synthesis, in particular for the modulating and demodulating signals, and provides a frequency synthesis method and system using a phase locked loop and having a short phase locking time.

FIELD OF THE INVENTION

Many methods and systems for synthesizing frequencies to provide an output signal whose frequency is an integer multiple of the frequency of a reference signal are known in the art, in particular methods and systems using a phase locked loop. In these methods and systems, the output signal is compared to a reference signal, normally after frequency division, and the phase difference controls the output.

The output signal is generally generated by a voltage-controlled oscillator (VCO) to which the filtered output signal of the phase comparator is applied, constituting a frequency control input signal.

For example, these methods and systems find applications in the send and receive modules of communication systems, in particular of radiocommunication systems, constituting means for changing send or receive channels.

Frequency synthesizers have been developed more recently that integrate fractional frequency dividers in their phase locked loop and can supply an output signal with virtually any frequency.

On changing channel, it is necessary to modify the frequency of the output signal and therefore to lock the phase locked loop to said new frequency.

These frequency changing and locking procedures lead to non-negligible waiting times and unnecessary consumption of energy and are not user friendly.

To shorten these procedures, it has been proposed in particular to use a fractional division phase locked loop with a variable cut-off frequency band and to precharge an upstream capacitor.

However, this solution is difficult and delicate to implement, necessitates supplemental outputs and an additional implementation surface area, and increases energy consumption.

SUMMARY OF THE INVENTION

An object of the present invention is to alleviate the drawbacks previously cited and to propose a solution which can greatly improve the locking time using a fractional phase locked loop without generating unwanted radio frequency interference.

To this end, the present invention provides a frequency synthesis method using a phase locked loop including a phase comparator, said method including a step of switching from a fractional frequency division operating mode to an integer frequency division operating mode after a time or time-delay for stabilizing operation of said loop has elapsed, which method is characterized in that it consists of effecting said operating mode switching by masking or eliminating a portion of the pulses of a reference signal and a comparison signal before they are applied to inputs of the phase comparator.

It also provides a frequency synthesizer system using a phase locked loop and including a generator whose output signal has a frequency controlled as a function of the signal delivered by a phase comparator whose inputs receive a reference signal and a comparison signal coming from a feedback subsystem connecting the output of said controlled frequency generator to an input of said phase comparator and integrating a fractional frequency divider, characterized in that it also includes a generator for generating masking or elimination signals applied, as command or authorization signals, to discriminator or filter circuits connected in series, one in the transmission line for the reference signal and the other in the feedback subsystem immediately upstream of the corresponding inputs of the phase comparator, switching from the fractional frequency division phase locked loop operating mode to the integer frequency division phase locked loop operating mode being effected by applying said masking or elimination signals.

The basic idea of the present invention lies in switching from a fractional division phase locked loop (with no additional implementation) to a conventional phase locked loop (with integer division) after the stabilization time delay, with or without modification of the bandwidth of said phase locked loop and, in any event, without generating interference.

The solution proposed by the invention leads to masking of some pulses, so that the phase comparator is activated as in a conventional phase locked loop after a particular time-delay.

BRIEF DESCRIPTION OF THE DRAWINGS

The invention will be better understood from the following description, which relates to a preferred embodiment, provided by way of non-limiting example, and explained with reference to the accompanying diagrammatic drawings, in which.

DETAILED DESCRIPTION OF THE INVENTION

The present invention relates to a frequency synthesis method using a phase locked loop 2 including a phase comparator 3, the method including a step of switching from a fractional frequency division operating mode to an integer frequency division operating mode after a time-delay for operation of said loop 2 to stabilize has elapsed.

According to the invention, said operating mode switching is effected by periodically masking or eliminating a portion of the pulses of the reference signal Sref and the comparison signal Scomp before they are applied to the inputs of the phase comparator 3.

Said masking or said elimination preferably begins after a predetermined time delay (an optimum value for which can be determined beforehand, by trial and error), in a fraction of the time allocated for locking the phase locked loop 2.

The invention therefore aims to exploit the much greater number of pulses applied to the phase comparator 3 in the fractional division phase locked loop (PLL) operating mode in order to lock the loop faster, without having to accept the drawbacks associated with the implementation and use of a fractional division loop.

Figures 2, 3:
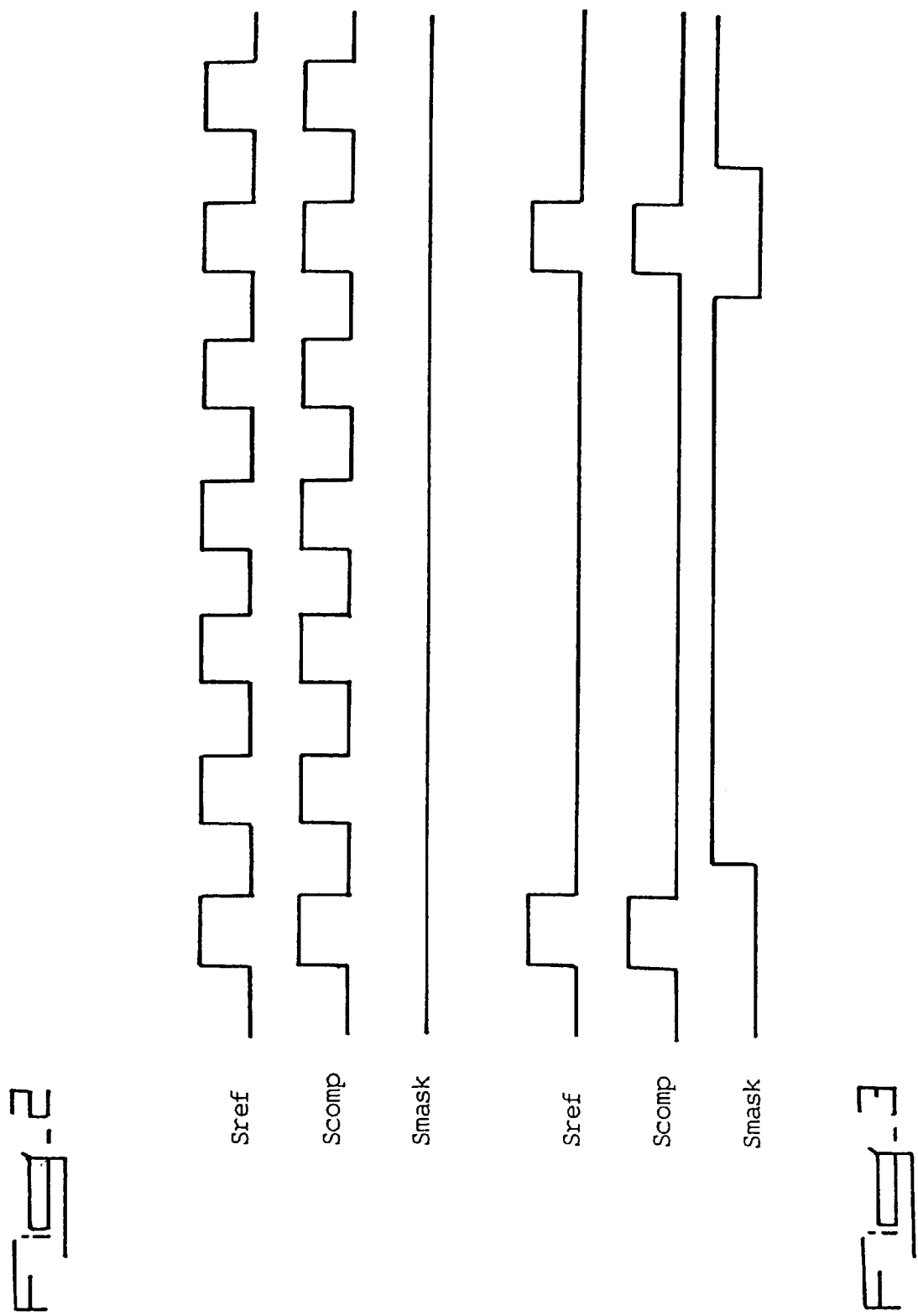
FIG. 2 represents timing diagrams of reference, comparison and masking signals before switching (fractional phase locked loop operation mode)
FIG. 3 represents timing diagrams of reference, comparison and masking signals after switching (conventional phase locked loop operation mode).

As shown by comparing the FIGS. 2 and 3 timing diagrams, all of the pulses of the signals Scomp and Sref present in the conventional PLL operating mode are already present in the signals in the fractional division PLL operating mode, the change from the second mode to the first being effected by simply applying a mask to retain only the necessary pulses in said second operating mode.

In a preferred embodiment of the invention, the masking or elimination is effected by generating a signal Smask for filtering or discriminating between the pulses of the reference signal Sref and the comparison signal Scomp coming from the feedback subsystem 2' of said phase locked loop 2.

In a first embodiment, the masking or elimination signal Smask is a two-state signal and is applied, as a change command or change authorization signal, to circuits 4, 4' forming transfer locks and connected in series in the line for transmitting the reference signal Sref and in the feedback subsystem 2' immediately upstream of the inputs of the phase comparator 3.

In a second embodiment, the masking or elimination signal Smask is a two-state signal and is applied, possibly after inversion, to one input of AND gates 4, 4' connected in series, one in the line for transmitting the reference signal Sref and the other in the feedback subsystem 2', and whose outputs are connected to the inputs of the phase comparator 3, the other inputs of said AND gates 4, 4' respectively receiving the reference signal Sref and the comparison signal Scomp coming from the feedback subsystem 2'.

Figure 1:
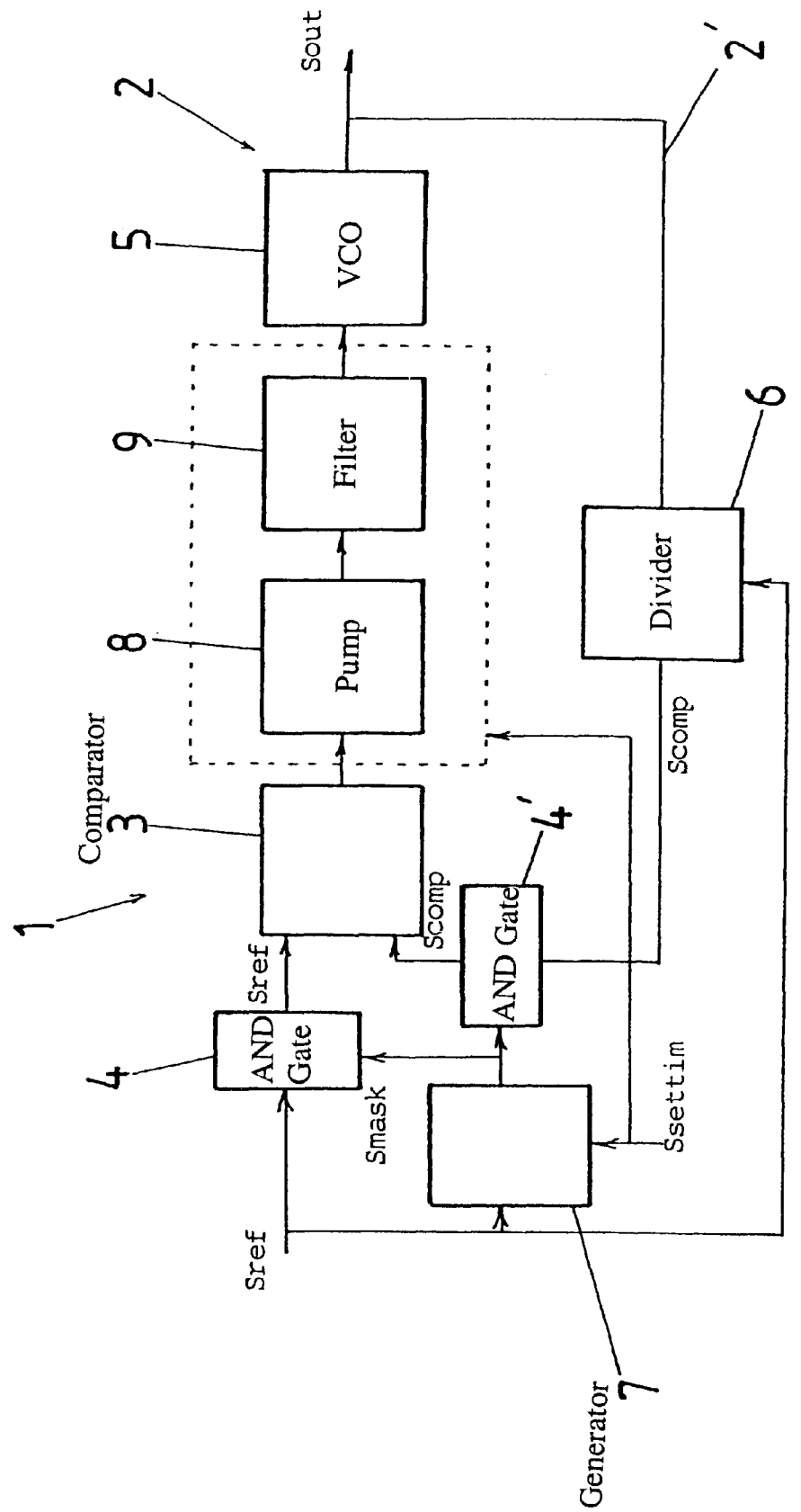
FIG. 1 is a block diagram of a frequency synthesizer system according to the invention.

As shown in FIG. 1 of the accompanying drawings, the present invention also provides a frequency synthesizer system 1 using a phase locked loop 2 and including a generator 5 (for example a VCO) whose output signal frequency is controlled as a function of the signal delivered by a phase comparator 3 whose inputs receive a reference signal Sref and a comparison signal Scomp coming from a feedback subsystem 2' connecting the output of said controlled frequency generator 5 to an input of said phase comparator 3 and integrating a fractional frequency divider 6.

This system 1 is characterized in that it also includes a generator 7 for generating masking or elimination signals Smask applied as command or authorization signals to discriminator or filter circuits 4, 4' connected in series, one in the line for transmitting the reference signal Sref and in the other in the feedback subsystem 2' immediately upstream of the corresponding inputs of the phase comparator 3, the switching from a fractional frequency division phase locked loop operating mode to an integer frequency division phase locked loop operating mode being effected by applying said masking or elimination signals Smask.

In a preferred embodiment of the invention, the generator 7 for generating the masking or elimination signals Smask delivers a two-state or squarewave signal, after a predetermined time-delay, in a fraction of the time allocated for locking the phase locked loop 2, said masking or elimination signal Smask having a variable cyclic ratio.

Consequently, the system 1 operates with a fractional division phase locked loop during a transient locking phase and with a conventional phase locked loop whose output signal Sout is locked to the required frequency during the permanent operation phase.

To synchronize the operation of the various circuits constituting the system 1 during the stabilization, locking, switching and permanent operation phases, the reference signal Sref is applied as a sequencing signal to the generator 7 for generating the masking or elimination signals Smask and to the fractional frequency divider 6.

Also, a signal Ssettim indicating the time interval allocated to locking the phase locked loop 2 is delivered to said generator 7 for generating masking or elimination signals Smask and to a [charge pump 8/integrator filter 9] module between the output of the phase comparator 3 and the input of the generator 5 for generating the output signal Sout of said system 1.

For example, the discriminator or filter circuits 4, 4' can consist of circuits forming transfer locks or of logic gates, for example AND or OR gates.

The invention also relates to a mobile telecommunication terminal including a frequency synthesizer device 1 as described above and employing the method previously cited.

Of course, the invention is not limited to the embodiment described and shown in the accompanying drawings, which can be modified without departing from the scope of protection of the invention, in particular from the point of view of the composition of the various components or by substituting technical equivalents.

What is claimed is:

1. A frequency synthesizer system using a phase locked loop, the system comprising:

a phase comparator receiving a masked comparison signal coming from a feedback subsystem and a masked reference signal;

a frequency controlled generator for generating an output signal having a frequency controlled as a function of an output signal generated by the phase comparator, the feedback subsystem connecting the output of said frequency controlled generator to an input of said phase comparator by a fractional frequency divider;

a masking signal generator for generating a masking signal; and first and second AND gate circuits connected immediately upstream of corresponding inputs of the phase comparator, said first and second AND gate circuits receiving a reference signal and a comparison signal, respectively, the frequency synthesizer switching from the fractional frequency division phase locked loop operating mode to the integer frequency division phase locked loop operating mode by applying said masking signal to said first and second AND gate circuits in order to mask a portion of the pulses of the reference signal and the comparison signal to generate said masked reference signal and said masked comparison signal which are applied to the inputs of the phase comparator.

2. A system according to claim 1, wherein the masking signal generator for generating the masking signal delivers a squarewave signal after a predetermined time-delay in a fraction of the time allocated for locking the phase locked loop.

3. A system according to claim 2, wherein the masking signal is a clock signal and has a variable cyclic ratio.

4. A system according to claim 1, wherein the reference signal is applied, as a sequencing signal, to the masking signal generator and to the fractional frequency divider, and a signal indicating the time interval allocated to locking the phase locked loop is delivered to said masking signal generator and to a module between the output of the phase comparator and the input of the frequency controlled generator.

5. A mobile radio telecommunication terminal, further comprising a frequency synthesizer system according to claim 1.

6. A frequency synthesis method using a phase locked loop including a phase comparator, said method comprising switching from a fractional frequency division operating mode to an integer frequency division operating mode after a time or time-delay for stabilizing operation of said phase locked loop has elapsed, wherein said switching comprises applying a masking signal, a reference signal and a comparison signal to AND gate circuits in order to mask a portion of the pulses of the reference signal and the comparison signal before said reference signal and said comparison signal are applied to inputs of the phase comparator.

7. A method according to claim 1, wherein said masking begins after a predetermined time-delay, in a fraction of the time allocated for locking the phase locked loop.

8. A method according to claim 1, wherein the masking is performed by generating a signal for filtering or discriminating between pulses of the reference signal and the comparison signal coming from a feedback subsystem of said phase locked loop.

9. A method according to claim 8, wherein the masking signal to inputs of first and second AND gates the first AND gate is in the line for transmitting the reference signal and the second AND gate is in the feedback subsystem, the first and second AND gates have outputs which are connected to inputs of the phase comparator, and other inputs of said first and second AND gates respectively receive the reference signal and the comparison signal coming from the feedback subsystem.

* * * * *